United States Patent [19]

Jhabvala

[11] 4,119,996
[45] Oct. 10, 1978

[54] COMPLEMENTARY DMOS-VMOS INTEGRATED CIRCUIT STRUCTURE

[75] Inventor: Murzban D. Jhabvala, Seabrook, Md.

[73] Assignee: The United States of America as represented by the Administrator of the National Aeronautics and Space Administration, Washington, D.C.

[21] Appl. No.: 817,413

[22] Filed: Jul. 20, 1977

[51] Int. Cl.² ........................................ H01L 29/78
[52] U.S. Cl. ...................................... 357/23; 357/22; 357/41; 357/45; 357/55
[58] Field of Search .................. 357/22, 23, 55, 41, 357/45

[56] References Cited

U.S. PATENT DOCUMENTS

| 3,975,221 | 8/1976 | Rodgers | 357/55 |
| 4,049,476 | 9/1977 | Horie | 357/55 |

*Primary Examiner*—Edward J. Wojciechowicz
*Attorney, Agent, or Firm*—Robert D. Marchant; John R. Manning; John O. Tresansky

[57] ABSTRACT

A high speed CMOS formed on a single semiconductor substrate includes a DMOS having an asymmetric channel and a VMOS with a relatively short channel length. The short channel length of the VMOS is achieved by: (1) forming a double diffusion along one edge of a V groove, or (2) ion implanting boron into the apex of the V groove and diffusing a single layer to a relatively deep depth along both edges of the groove.

16 Claims, 11 Drawing Figures

COMPLEMENTARY DMOS-VMOS INTEGRATED CIRCUIT STRUCTURE

ORIGIN OF THE INVENTION

The invention described herein was made by an employee of the United States Government and may be manufactured and used by or for the Government for governmental purposes without the payment of any royalties thereon or therefor.

BACKGROUND OF THE INVENTION

The present invention relates generally to transistors and more particularly to metal oxide semiconductor transistors.

Complementary metal oxide semiconductor (CMOS) transistors have received wide acceptance in digital circuitry because of the relatively small amount of power required thereby and the relatively high packing densities thereof, enabling many devices to be formed on a single integrated circuit (IC) chip. One transistor of a CMOS pair is formed by diffusing a relatively deep semiconductor well into a semiconductor substrate. A channel is formed in the well by diffusing two spaced layers into the well. An oxide layer covers the well and a portion of the two layers. Ohmic contacts are formed by metallizing the two diffusion layers comprising the channel and the oxide layer, whereby source, drain and gate electrodes are provided. The other, complementary transistor is formed by diffusing a pair of layers into the substrate to form a second channel. An oxide layer covers the second channel, as well as a portion of the two diffused layers of the second transistor. Ohmic metallized contacts are formed on the diffused layers and over the oxide of the semiconductor to provide the source, drain and gate electrodes of the second transistor. The gate electrodes of the two transistors are connected together.

Problems with the conventional prior art devices are: (1) a relatively slow response time, (2) relatively low transconductance which results in low gain, and (3) low breakdown voltage in response to the signal applied to the gate electrodes.

In one improved conventional prior art device a CMOS integrated circuit utilizes a symmetrical double diffused N-channel metal oxide semiconductor (DMOS) transistor and a P-channel metal oxide semiconductor (MOS) transistor. The response time of such a CMOS is limited by slow response time of the P-channel MOS, which is one of the aforementioned problems with conventional prior art devices. Because of the symmetrical properties of the DMOS, charged carriers flowing across the channel are both accelerated and decelerated causing a further response time impairment. The described CMOS integrated circuit appears to have improved packing density characteristics relative to the conventional CMOS, is easier to fabricate than the conventional CMOS, and has a faster response time than the conventional CMOS.

It has been previously realized that improved response times in MOS transistors can be obtained by employing an asymmetrical double diffused channel. In an asymmetrical DMOS transistor, a channel exists in the substrate between a pair of diffused layers (the double diffused layers) and a single diffused layer. A source region is formed by first diffusing a relatively low concentration P type dopant into a lightly doped or intrinsic substrate. Into the P layer is diffused an N+ layer that is completely surrounded by the P diffused layer. The drain region is formed by diffusing N+ dopant into the substrate, whereby the channel subsists between the P diffused layer and the N+ layer of the drain region. The asymmetrical, DMOS has a relatively fast response time because charged particles, as they flow across the channel, are only accelerated to the drain electrode; there is no deceleration and acceleration of the charged particles as they flow across the channel, as exists in the symmetrical DMOS. Attempts to form a CMOS out of a pair of opposite conductivity DMOS' have not been successful because of the cumbersomeness of the resulting structure, causing low packing densities and difficulties in fabrication.

SUMMARY OF THE INVENTION

In accordance with one aspect of the present invention, the results are achieved by forming an integrated circuit CMOS including an asymmetrical double diffused metal oxide semiconductor transistor (DMOS) as one of the devices, and a V-notched metal oxide semiconductor transistor (VMOS) as the other transistor of the pair. The V-notched transistor has a fast response time because it has a relatively short channel length. The short channel length is achieved without sacrificing the voltage breakdown characteristics of the device. In one configuration, the relatively short length is obtained by double diffusing relatively high concentrations into a well whereby double diffused layers subsist along one edge of the V notch, while a single diffused layer subsists along the other edge of the notch. The channel is formed through the lower diffused layer on the double diffused edge, between the well and the other diffused layer on the double diffused edge.

The V notch is formed on a plane having a crystalline surface state of <111> in a substrate having a crystalline structure of <100>. The resulting structure results in a shift in threshold voltage of the well so the well has a low impedance with zero bias applied to a metallized gate electrode that covers an oxide layer formed over exposed portions of the well and diffusion layers in the notch. With zero bias, the lower level of the double diffused layer is cut off; turn on is achieved by applying a forward bias voltage to the gate electrode to cause charges to flow across the relatively short length of the lower diffusion layer. There is a relatively high breakdown voltage for the device because the avalanche current, which must be achieved before breakdown results, must be through the relatively high concentration of the P+ channel of the double diffused edge to the diffusion layer along the other edge of the notch.

In accordance with another embodiment, a single diffusion layer is formed, to a relatively great depth, along each edge of the V notch. In the V notch, boron is ion implanted to increase the P-well concentration to ensure that the channel is not inverted to N type by the <111> surface orientation. Fast response time is achieved because of the relatively short distance of the channel, around the notch apex, between the two diffused layers.

It is realized that VMOS devices are known in the art, however, the devices in the prior art are not complementary, nor are they in combination with DMOS', and in particular, DMOS' having asymmetrical channels. Also, the prior art devices do not include a double diffused channel along one edge of the V notch. While some of the prior art devices are complementary, they are not, in fact, true V notch devices because the V merely mechanically isolates two separate, opposite conductivity type MOS devices. No conduction path exists around the apex of the V for carriers of a single MOS transistor.

Hence, there are in the present invention three separate and distinct inventive structural concepts, viz: (1) a CMOS formed on a single integrated circuit substrate with a DMOS forming one transistor and a VMOS forming the complementary transistor; (2) a CMOS with a pair of complementary transistors, one of which is a DMOS having an asymmetrical channel; and (3) a VMOS with a double diffused channel along one edge of the V notch. With regard to item (3), it is necessary to precisely control the location of the V notch to assure that one edge of the notch includes a pair of double diffused layers, while the other edge of the notch includes but a single layer. The three inventive concepts can be incorporated together to provide maximum beneficial results, or they can be independent, as the need dictates.

It is, accordingly, an object of the present invention to provide a new and improved metal oxide semiconductor transistor and method of making same.

Another object of the invention is to provide a new and improved integrated CMOS circuit.

A further object of the invention is to provide a relatively high speed CMOS that is relatively immune to outer space radiation, has a relatively high voltage breakdown, relatively high transconductance and is capable of high packing densities.

A still further object of the invention is to provide a new and improved method of fabricating a VMOS.

Another object of the invention is to provide a method of fabricating a VMOS having double diffused layers along one edge and a single diffused layer along another edge of the V notch.

Advantageously, the substrate is a lightly doped, N type semiconductor, the asymmetrical DMOS device is a P channel transistor, and the VMOS is an N channel transistor.

The above and still further objects, features and advantages of the present invention will become apparent upon consideration of the following detailed description of several specific embodiments thereof, especially when taken in conjunction with the accompanying drawings.

DESCRIPTION OF THE PREFERRED EMBODIMENTS

Figure 1:
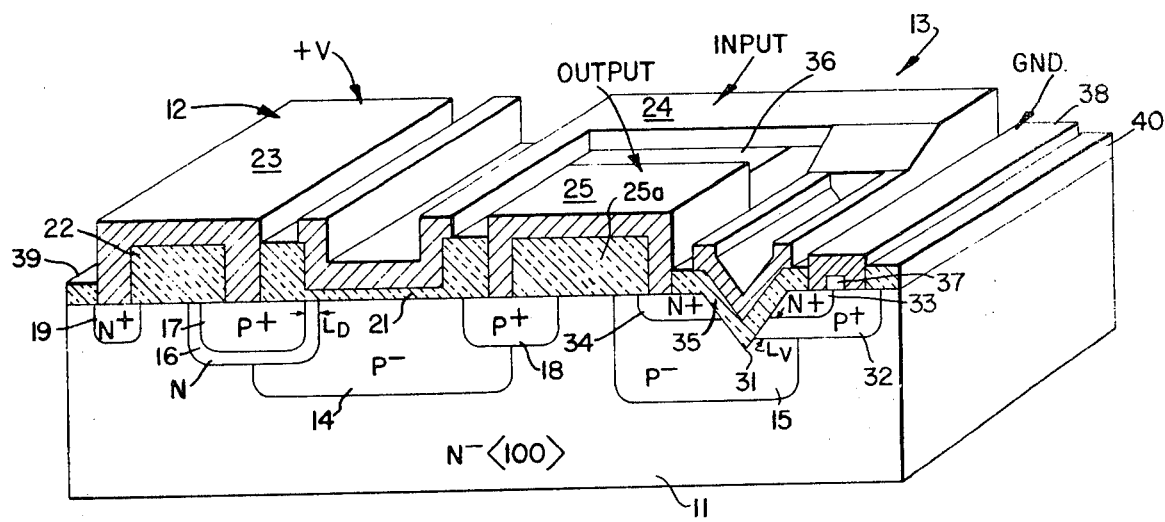
FIG. 1 is a perspective view of one embodiment of a CMOS including an asymmetrical DMOS and a VMOS, in accordance with one embodiment of the invention wherein the VMOS includes a double diffused layer along one edge of the V notch.

Reference is now made to FIG. 1 of the drawing wherein there is illustrated a lightly doped N type substrate 11 (N−), having a <100> crystalline structure and a conductivity of 5 to 10 ohm·cm. Formed on integrated circuit substrate 11 is an asymmetrical, P channel double diffused metal oxide semiconductor (DMOS) transistor 12 and an N channel metal oxide semiconductor transistor 13 having a V notch; transistor 13 is referred to as a VMOS. DMOS 12 and VMOS 13 are interconnected with each other to form a pair of complementary metal oxide semiconductor (CMOS) transistors.

DMOS 12 includes a lightly doped P (P−) region 14 that is diffused to a relatively deep depth in substrate 11 to form a well. A similar P− well 15 is diffused into substrate 11 to form a well. The P− well 15 is diffused into substrate 11 as a part of VMOS 13. N layer 16 is diffused into and abuts against a portion of well 14 adjacent one of the boundaries between the well and substrate 11, as well as into and in abutting relationship with the portion of substrate 11 adjacent well 14. A heavily doped P (P+) layer 17 is diffused into and abuts against layer 16 to complete the asymmetrical double diffused channel across layer 16, between layer 17 and well 14, as indicated by $L_D$. Layer 17 forms a source region of DMOS 12. A drain region for DMOS 12 is formed by diffusing a P+ layer 18 along the side of well 14 remote from layers 16 and 17 and into the adjoining portion of substrate 11, so that layer 18 abuts against these portions of well 14 and substrate 11. For biasing purposes, a heavily doped N (N+) layer 19 is diffused into and abuts against substrate 11 at a region remote from well 14, and in closest proximity to the edge where double diffusion layers 16 and 17 are located, but in spaced relationship to the double diffusion layers.

Insulating oxide layer 21 extends over the top of substrate 11, from the portion of P+ layer 17 adjacent N layer 16 to the portion of P+ layer 18 adjacent well 14; oxide layer 21 thereby extends over all of layer 16 and well 14. Oxide layer 22 extends over the surface of substrate 11 from the other side of P+ layer 17 adjacent N layer 16, to N+ layer 19; layer 22 thereby extends over all of layer 16 and substrate 11 between layers 17 and 19.

Source, drain and gate metal electrodes for DMOS 12 are formed by applying thin aluminum films 23, 24 and 25 over oxide layers 21 and 22, and into contact with diffused layers 17, 18 and 19. In particular, aluminum layer 23 is deposited over oxide layer 22 and into ohmic contact with diffused layers 17 and 19 to form a source electrode for DMOS 12. A gate electrode for DMOS 12 is formed by depositing aluminum layer 24 over oxide layer 21 so that the aluminum layer projects over the edges of P+ regions 17 and 18, as well as over well 14 and the portion of N layer 16 between layer 17 and well 14. Of course, metal layer 24 is separated from each of layers 16, 17 and 18, as well as well 14, by insulating oxide layer 21. The drain electrode for DMOS 12 is formed as an ohmic contact by aluminum layer 25 over P+ layer 18.

V notch 31 is formed in the <111> crystalline plane of substrate 11, utilizing known etching techniques. Along the wall or edge of notch 31 remote from DMOS 12, a double diffused configuration is established by diffused P+ layer 32 and N+ layer 33. Mutually abutting layers 32 and 33 extend against the wall of notch 31. Layer 32 is diffused into and abuts against well 15, and extends underneath layer 33, to the edge of layer 33, at which point layer 32 extends to the surface of substrate 11. On the other wall of V notch 31, an N+ layer 34 is diffused into and abuts against well 15. P+ layer 32 extends across the common boundary between well 15 and substrate 11.

Covering V notch 31, as well as part of the exposed surfaces of N+ layers 33 and 34, is an insulating oxide layer 35 that is integral with oxide layer 21, by virtue of oxide strip 36 that extends between the two oxide layers. The boundary between P+ and N+ layers 32 and 33, on the surface of substrate 11, is covered with oxide, insulating layer 37 to provide required electrical isolation. Electrical isolation between DMOS 12 and VMOS 13, on the surface of substrate 11, is also provided by oxide layer 25a, that is spaced from all segments of oxide layers 21, 35 and oxide strip 36 by aluminum layer 25. Aluminum layer 25 is in ohmic contact with N+ layer 34, on the surface of substrate 11, to form a source electrode for the N channel VMOS transistor 13. The gate electrode for VMOS 13 is formed by metal layer 24, that extends behind oxide strip 36 and into the V portion of oxide layer 35. A drain electrode for VMOS 13 is formed by aluminum layer 38 that covers oxide layer 37 and is in ohmic contact with P+ layer 32 and N+ layer 33. Insulating layers 39 and 40 are grown along the remote edges of metal layers 23 and 38, in abutment with inner portions of N+ layer 19 and of P+ layer 32 to provide electrical isolation between the CMOS device illustrated and other devices (not shown) that are formed on substrate 11.

The N channel for VMOS 13 is formed vertically through P+ layer 32, between well 15 and N+ layer 33. Because the V notch is formed in the <111> planes of substrate 11, there is a relatively low impedance path from N+ region 34 to P+ region 32, around the apex of notch 31 in response to a zero gate bias being applied to aluminum layer 24. An N channel cut off region, therefore, exists through P+ layer 32, along a relatively short length, as indicated by $L_V$. In response to a positive gate voltage being applied to layer 24, conduction occurs through P+ layer 32 because of the electrostatic field produced in the layer by the voltage in the V portion of layer 24. For this reason, it is essential that the metallized portion of layer 24 extend into V notch 31 to a depth at least equal to the depth of layer 32. Also, it is necessary for the V notch to be formed so that layers 32 and 33 subsist along only one edge of notch 31.

Because the length across the channel formed between well 15 and layer 33 is so short, an order of magnitude less than in conventional MOS technology, scattering limited carrier velocity occurs, to minimize the transit time of carriers across the channel. There is a resulting reduction, by an order of magnitude, in propagation delay across the channel, with a similar reduction in the propagation delay-power product of the device. Because avalanche current conditions do not exist in well 15, between N+ layer 34 and P+ region 32 while zero bias is applied to the gate electrode comprising aluminum layer 24, the breakdown characteristics of the device are not impaired by the short channel length.

The device has a fast response time because both the DMOS and VMOS transistors 12 and 13 have high speed channels. The asymmetric DMOS has fast transit time across the channel because a carrier is accelerated as it crosses the channel between layer 17 and well 14. In contrast, in the symmetric DMOS configuration, a carrier is both accelerated and decelerated as it crosses the relatively short channel length. Because double diffusion in DMOS 12 occurs only on the side of the device where the source electrode is located, there is a relatively high voltage breakdown between the source and drain electrodes of the DMOS device; as was previously pointed out, the VMOS device inherently has a high breakdown voltage.

The device operates in the normal manner of a CMOS. In particular, in response to a zero bias being applied to the substantially short circuited gate electrodes of DMOS 12 and VMOS 13, as formed by aluminum layer 24, P channel transistor 12 is in a conducting state so that current flows from a positive source biasing layer 23 through the P channel formed between layer 17 and well 14 to the drain electrode formed by aluminum layer 25. Simultaneously, VMOS transistor 13 is in a cutoff state because the N channel, between well 15 and N+ region 33 is cut off, and the voltage applied to aluminum layer 23 is supplied to a load that is connected to aluminum layer 25. In response to a positive bias being applied to aluminum layer 24, the P channel of DMOS 12 is cut off, while the N channel of VMOS 13 is in a relatively low impedance state, whereby the ground potential of layer 38 is coupled through the N channel to aluminum layer 25, causing the voltage at an output terminal connected to layer 25 to be at ground level.

The DMOS and VMOS devices 12 and 13 have been fabricated with channel lengths of between 0.5 and 1.0 microns. Devices having cutoff frequencies of approximately 2 gHz were formed, with maximum transconductances of 190 micromhos for P channel transistor 12 and 490 micromhos for N channel transistor 13. The N channel and P channel transistor widths were 1.1 mils and 0.7 mils, respectively. The absolute value of the threshold voltage of the individual devices were between 0.8 and 4.0 volts; the the device was found to operate satisfactorily for supply voltages ranging from 2 to 15 volts for the voltage applied to alluminum layer 23.

Figure 2:
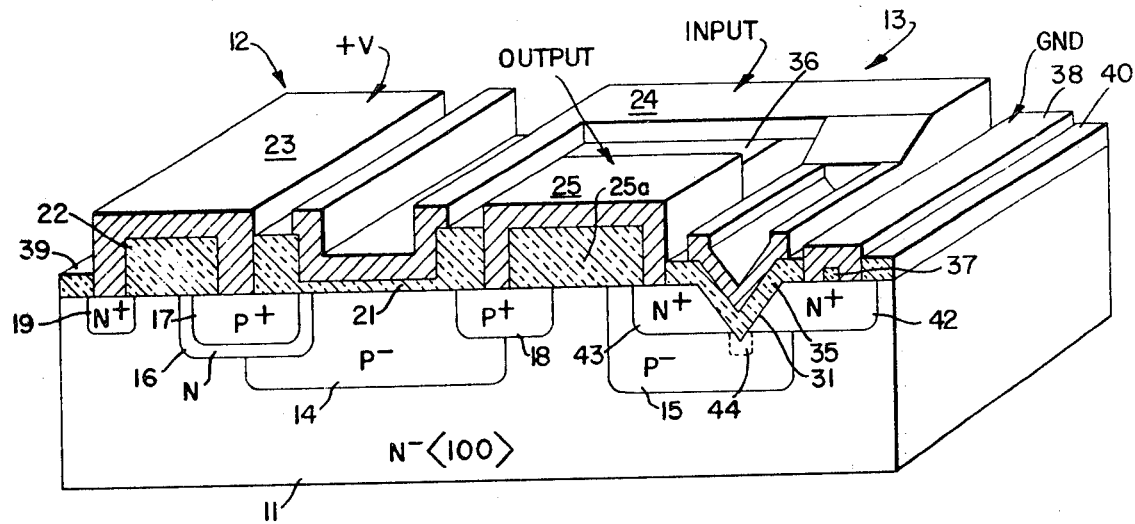
FIG. 2 is a perspective view of a second embodiment of a CMOS including a DMOS and a VMOS having relatively deep diffused layers that are separated from each other by ion implanted boron around the apex of the V notch.
Figure 3:
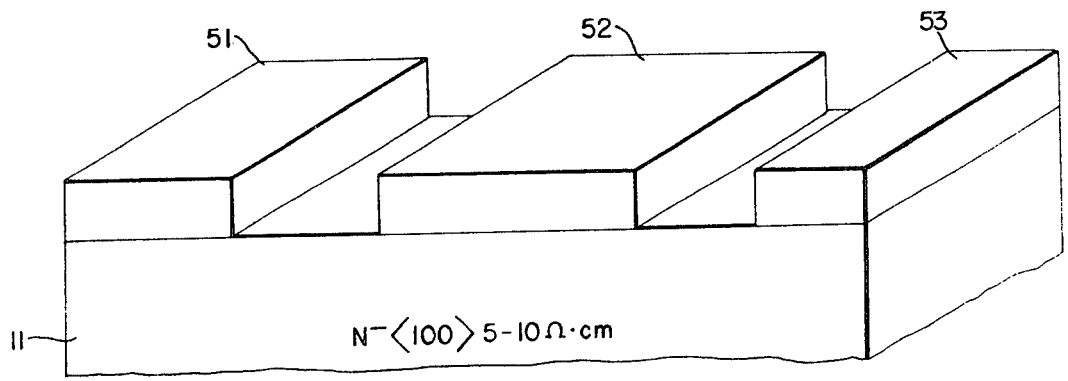
FIGS. 3-11 are illustrations of the steps employed in fabricating the device of FIG. 1.

In accordance with a modification of the device, as illustrated in FIG. 2, VMOS 13 includes only one N+ diffusion layer 42 and 43, on each edge of V notch 31. Layers 42 and 43 are diffused into well 15 to approximately the same depth as the combined depths of layers 32 and 33, so that a relatively short channel length subsists around the apex of the V notch through well 15, between layers 42 and 43. To establish a channel around the apex of the V notch through well 15 and retain the high voltage breakdown characteristics of the device, a mass of boron ions 44 is implanted into well 15 in the vicinity of the apex of notch 31. The short channel length also retains the high frequency characteristics of the device. Typically, the boron ions are implanted to a concentration of $5 \times 10^{11}$ carriers per square centimeter, in the vicinity of the apex.

Figure 4:
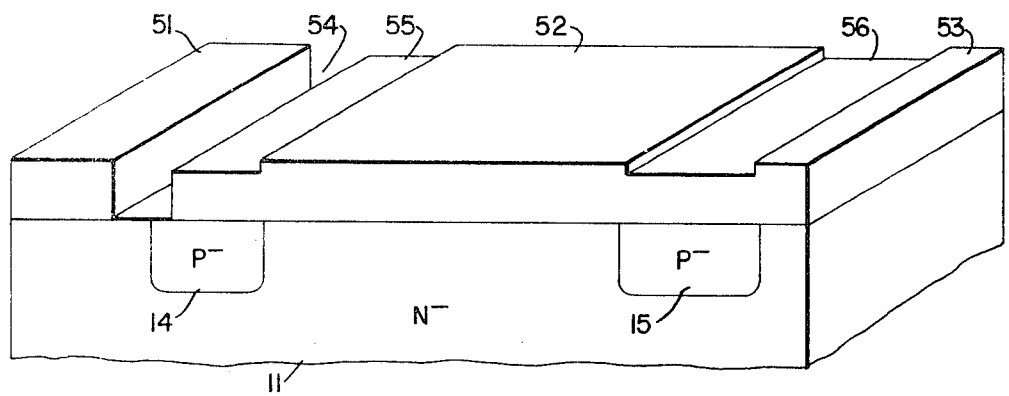
Figure 5:
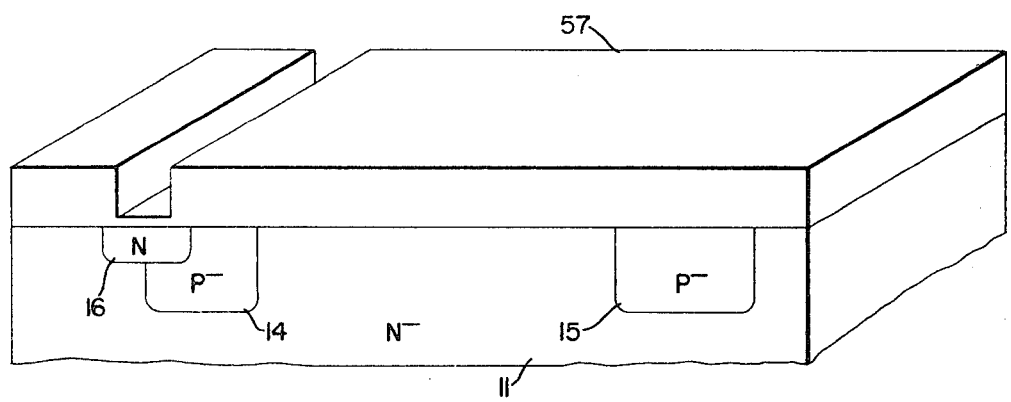

Reference is now made to FIGS. 3-11 wherein the process of forming the device illustrated in FIG. 1 is illustrated in a step-by-step manner. An N− <100> substrate 11, having a conductivity of 5-10 ohm·cm has silicon dioxide layers 51, 52 and 53 defined thereon. Layers 51, 52 and 53 are formed by conventional photolithographic masking techniques. P− wells 14 and 15 are then formed by diffusing dopant into the exposed surface of substrate 11, between the spaced areas of oxide layers 51, 52 and 53, as illustrated in FIG. 4. A mask then covers the structure by oxide layers 55 and 56 that are grown over wells 14 and 15. A portion of oxide layer 52 is etched away, to the left of P− region 14 to form groove 54. N region 16 is then formed by diffusion through slot 54, as illustrated in FIG. 5. A very thin silicon dioxide layer is then grown so that the entire substrate is covered by oxide layer 57, having a relatively narrow thickness immediately above most of layer 16, and a considerably greater thickness over the remainder of substrate 11.

Figure 6:
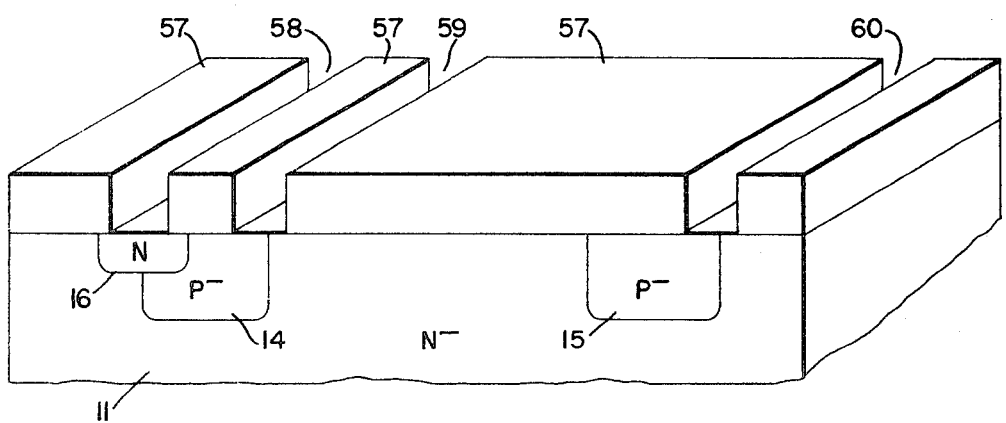
Figure 7:
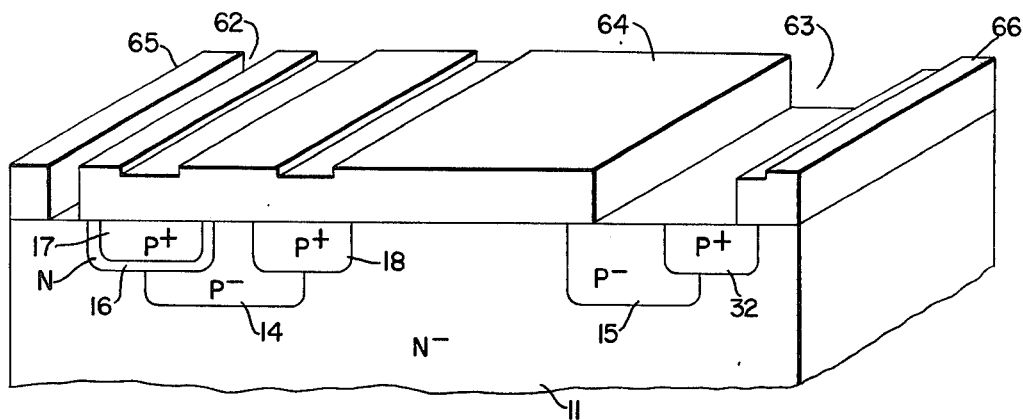
Figure 8:
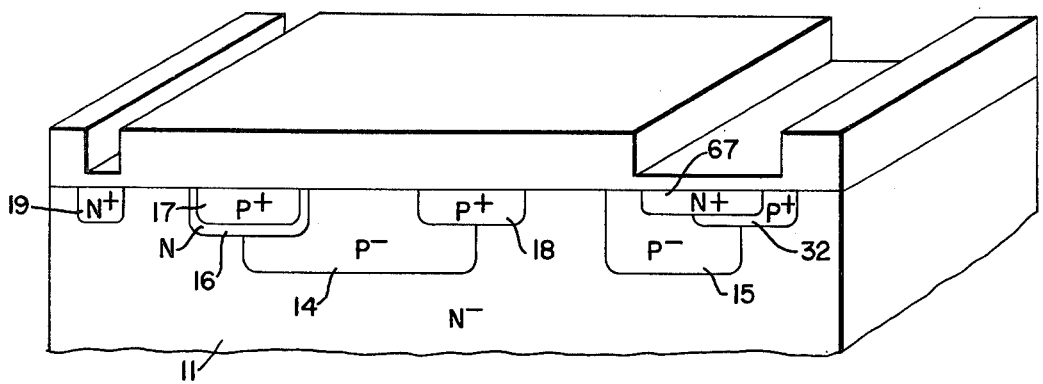

A mask is then placed over oxide layer 57 and the oxide layer is etched to form grooves 58, 59 and 60 in layer 57. Groove 58 exposes diffusion layer 16, while grooves 59 and 60 expose portions of wells 14 and 15, along one side of the wells, as well as the adjacent portions of substrate 11, as illustrated in FIG. 6. P+ layers 17, 18 and 32 are diffused into grooves 58, 59 and 60, as illustrated in FIG. 7. Grooves 62 and 63 are then formed by etching portions of silicon dioxide layer 57. Groove 62 is etched to the left of the double diffused region including layers 16 and 17, while groove 63 is etched across a majority of diffused layers 15 and 32 forming spaced oxide layers 64, 65 and 66. As indicated in FIG. 8, N+ layers 19 and 67 are then diffused into the spaces formed by grooves 62 and 63. N+ layers 19 and 67 are diffused to a depth that is less than the depth of P+ layer 32 so that a double diffused layer is formed in well 15.

Figure 9:
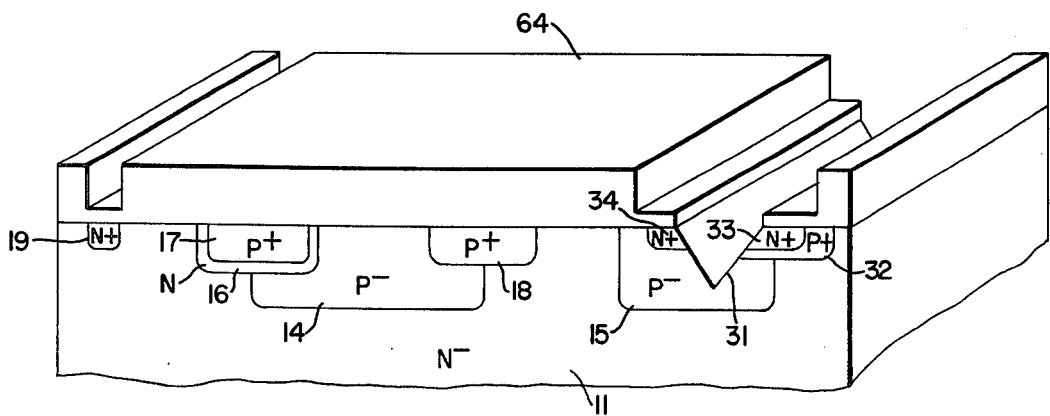

The next series of steps involves forming V notch 31 in diffused layers 15, 32 and 67. To this end, a mask is placed over the substrate, which mask has an opening that projects above the center of well 15, so that one edge of the mask is above layer 67, to the exclusion of layer 32, while the other edge of the mask is above both layers 67 and 32. As illustrated in FIG. 9, the V groove is then formed by applying an etchant solution of water and $N_2H_4$ (hydrazine) at 100° C. or a solution of potassium hydroxide, at 80° C. The etchant solution is self-stopping in the <111> crystalline plane of substrate 11 at a depth of approximately 70% of the opening of the mask. By proper alignment of the mask, the V notch extends into substrate 11 so that one edge of the notch intersects the left portion of diffusion layer 67 and well 15, while the other edge of the V notch intersects well 15, diffusion layer 32 and the right portion of layer 67. Thereby, layers 33 and 34 (FIG. 1) on opposite sides of the V notch are formed.

Figure 10:
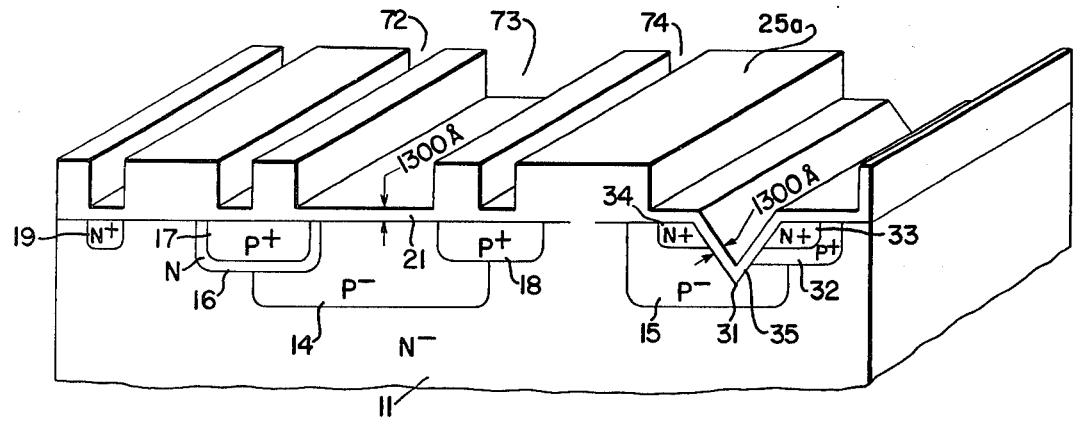
Figure 11:
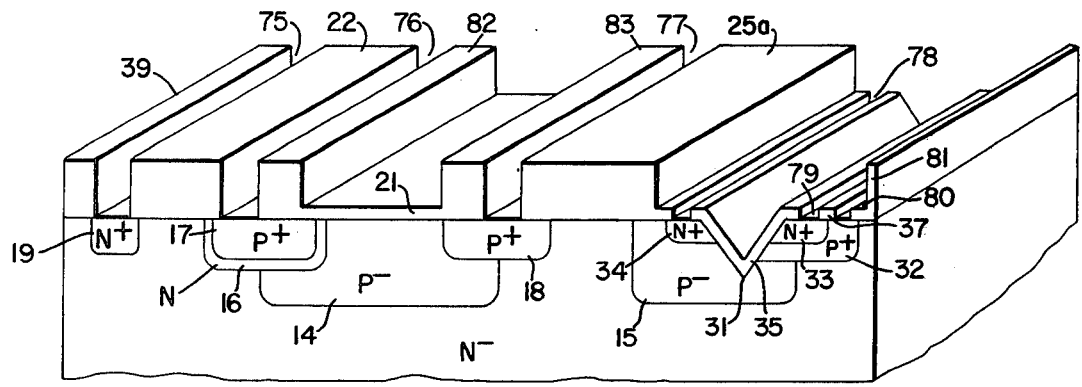

A mask is then placed over the substrate and the oxide layers are selectively etched to form slits 72, 73 and 74 in oxide layer 64, as illustrated in FIG. 10. Slits 72 and 74 cover P+ layers 17 and 18; slit 73 also covers the region extending to the left of the right edge of P+ region 17, over the right segment of N region 16 and over most of P− well 14, just to the left of P+ region 18. Slit 74 extends over a central portion of P+ region 18. 1300 Å thick oxide layers 21 and 35 are then grown in slits 72, 73 and 74, as well as in V notch 31, and to either side of the V notch. These 1300 Å thick oxide regrowth layers form oxide layers 21 and 35 of DMOS 12 and VMOS 13. A mask is then placed over the substrate and the oxide layers are etched to the surface of substrate 11 to form grooves 75, 76, 77, 78, 79 and 80 in the oxide layer as illustrated in FIG. 11. Each of grooves 75–80 extends all the way to the surface of substrate 11 forming oxide layers 39, 22, portions 82 and 83 of oxide layer 64, 35, 37 and 81. Grooves 75, 76 and 77 are respectively coincident with grooves 62, 72 and 74, except for the depth of the grooves in the latter instances. Groove 78 subsists between oxide layer 35 in the groove 31 and oxide layer 25a to expose N+ layer 34. Slot 79 extends between the right side of oxide layer 35 and the left side of oxide layer 37 to expose N+ layer 33. Groove 80 extends between the right edge of oxide layer 79 and the left corner of oxide region 81 to expose P+ layer 32.

Aluminum is evaporated over the entire substrate and then through conventional photolithographic techniques metal layers 23, 24, 25 and 38 are formed by well-known selective etching techniques.

The device illustrated in FIG. 2 is formed similarly to the device of FIG. 1. However, in forming the device of FIG. 2, a single, relatively deep N+ layer is formed in well 15, instead of the relatively deep P+ well 32, as indicated in FIG. 7. V notch 31 is formed, as indicated in FIG. 9, and boron ions are then implanted into the V notch by utilizing conventional techniques. The oxide and metal layers are then formed as described supra in connection with the embodiment of FIG. 1.

While there have been described and illustrated several specific embodiments of the invention, it will be clear that variations in the details of the embodiments specifically illustrated and described may be made without departing from the true spirit and scope of the invention as defined in the appended claims.

What is claimed is:

1. A metal oxide semiconductor transistor comprising:
    a region of a first semiconductivity type;
    a V-notch extending into said region;
    a first doped layer abutting said region and a portion of a first edge of said V-notch, said first layer being of a second conductivity type;
    a second doped layer having a portion thereof abutting said region and a portion of a second edge of said V-notch, said second layer being of said first conductivity type and having a carrier concentration greater than said region;
    a third doped layer abutting said second layer remote from said region and abutting another portion of said second edge of said V-notch, said third layer being of said second conductivity type;
    a first insulating layer abutting said region and said first, second, and third layers in contact with said first and second edges of said V-notch, said first insulating layer further contacting portions of said first and third layers remote from said V-notch;
    a second insulating layer spaced from said first insulating layer and abutting another portion of said third layer remote from said V-notch and abutting a portion of said second layer remote from said V-notch;
    a first electrode in ohmic contact with another portion of said first layer remote from said V-notch;
    a second electrode covering said second insulating layer having a portion thereof in ohmic contact with said third layer between said first and second insulating layers and another portion thereof in ohmic contact with another portion of said second layer remote from said V-notch;
    a third electrode abutting said first insulating layer;
    said region having a relatively low impedance from said first layer, along said first edge of said V-notch, around the apex of said V-notch, and along said second edge of said V-notch to said second layer in response to a zero bias being applied to said third electrode; and
    said second layer forming a stopping channel therethrough to electron conductance during said zero biasing and forming a short channel length electron conductance path therethrough with fast response time in response to a positive bias being applied to said third electrode.

2. The transistor of claim 1 further including a semiconductor substrate for said region, said substrate being of said second conductivity type and having a <100> crystal structure, said V notch being formed in <111> stopping planes of said substrate.

3. The transistor of claim 2 wherein said first and second conductivity types are respectively P and N.

4. A metal oxide semiconductor transistor comprising:
a region of a first semiconductivity type;
a V-notch extending into said region;
a first doped layer abutting said region and a portion of a first edge of said V-notch, said first layer being of a second conductivity type;
a second doped layer having a portion thereof abutting said region and a portion of a second edge of said V-notch, said second layer being of said first conductivity type and having a carrier concentration greater than said region;
a third doped layer abutting said second layer remote from said region and abutting another portion of said V-notch, said third layer being of said second conductivity type;
an insulating layer abutting said region and said first, second, and third layers in contact with said first and second edges of said V-notch, said insulating layer further contacting portions of said first and third layers remote from said V-notch;
a first electrode in ohmic contact with another portion of said first layer remote from said V-notch;
a second electrode having a portion thereof in ohmic contact with another portion of said third layer remote from said V-notch and another portion thereof in ohmic contact with a portion of said second layer remote from said V-notch;
a third electrode abutting said insulating layer;
said region having a relatively low impedance from said first layer, along said first edge of said V-notch, around the apex of said V-notch, and along said second edge of said V-notch to said second layer in response to a zero bias being applied to said third electrode; and
said second layer forming a stopping channel therethrough to electron conductance during said zero biasing and forming a short channel length electron conductance path therethrough with fast response time in response to a positive bias being applied to said third electrode.

5. The transistor of claim 4 further including a semiconductor substrate for said region, said substrate being of said second conductivity type and having a <100> crystal structure, said V notch being formed in <111> stopping planes of said substrate.

6. An integrated circuit CMOS device comprising:
a semiconductor substrate;
a first metal oxide semiconductor transistor formed in said substrate, said first transistor including;
a region of a first conductivity type formed in a portion of said substrate,
a first doped layer having a portion thereof abutting said region and another portion thereof abutting said substrate, said first layer being of a second conductivity type,
a second doped layer abutting said first layer remote from said region and said substrate, said second layer being of said first conductivity type,
a third doped layer having a portion thereof abutting said region remote from said first layer and another portion thereof abutting said substrate remote from said first layer, said third layer being of said first conductivity type,
an insulating layer abutting a portion of said second and third layers and covering said first layer and said region,
a source electrode in ohmic contact with another portion of said second layer,
a drain electrode in ohmic contact with another portion of said third layer,
a gate electrode in abutting contact with said insulating layer, and
said first layer forming an asymmetrical channel therethrough of said first conductivity type between said second and third layers and having an impedance controlled by the voltage applied between said gate and said drain electrodes;
a second metal oxide semiconductor transistor formed in said substrate, said second transistor including;
source, drain and gate electrodes, and
a channel of said second conductivity type having an impedance controlled by the voltage applied between said gate and said drain electrodes;
said drain and source electrodes of said first and second transistors respectively being formed by a common metal electrode in ohmic contact with opposite conductivity doped layers of said first and second transistors respectively; and
said gate electrodes of said first and second transistors being substantially short circuited together.

7. The device of claim 6 wherein said second transistor further includes:
a region formed in said substrate remote from said region of said first transistor, said region being of said first conductivity type;
a V-notch extending into said region;
a first doped layer abutting a portion of a first edge of said V-notch, said first layer being of said second conductivity type;
a second doped layer abutting a portion of a second edge of said V-notch opposed from said first layer, said second layer being of said second conductivity type;
an insulating layer abutting said region and said first and second layers in contact with said first and second edges of said V-notch, said insulating layer further contacting portions of said first and second layers remote from said V-notch; and
said gate electrode for said second transistor being in contact with said insulating layer.

8. The device of claim 7 wherein said first layer of said second transistor abutts said region of said second transistor.

9. The device of claim 8 further including a third doped layer between said region of said second transistor and said second layer of said second transistor, said third layer having a portion thereof abutting said region of said second transistor and another portion of said second edge of said V-notch, said third layer having another portion thereof abutting said substrate, and said third layer being of said first conductivity type and having a carrier concentration greater than the conentration of said region of said second transistor, whereby said channel for said second transistor is formed through said third layer.

10. The device of claim 9 wherein said region of said second transistor has a relatively low impedance from said first layer of said second transistor, along said first edge of said V-notch, around the apex of said V-notch, and along said second edge of said V-notch to said third layer in response to a zero bias being applied to said gate electrode of said second transistor.

11. The device of claim 10 wherein said third layer of said second transistor froms a stopping channel therethrough to electron conductance during said zero biasing and forming a short channel length electron conductance path therethrough with fast response time in response to a positive bias being applied to said gate electrode of said second transistor.

12. The device of claim 11 wherein said substrate has a <100> crystalline structure and said V notch is formed in <111> stopping planes of said substrate.

13. The device of claim 8 wherein said second layer of said second transistor has a portion thereof abutting said region of said second transistor and another portion abutting said substrate.

14. The device of claim 13 wherein ions are implanted in said region of said second transistor in the vicinity of the apex of said V-notch to a concentration to provide a relatively large breakdown voltage between said first and second layers of said second transistor, said channel of said second transistor being of relative short length from said first layer of said second transistor, around the apex of said V-notch to said second layer of said second transistor.

15. An integrated circuit CMOS device comprising:
a semiconductor substrate;
a first metal oxide semiconductor transistor formed in said substrate, said first transistor including;
a region of a first conductivity type formed in a portion of said substrate,
a first doped layer having a portion thereof abutting said region and another portion thereof abutting said substrate, said first layer being of a second conductivity type,
a second doped layer abutting said first layer remote from said region and said substrate, said second layer being of said first conductivity type,
a third doped layer having a portion thereof abutting said region remote from said first layer and another portion thereof abutting said substrate remote from said first layer, said third layer being of said first conductivity type,
an insulating layer abutting a portion of said second and third layers and covering said first layer and said region,
a source electrode in ohmic contact with another portion of said second layer,
a drain electrode in ohmic contact with another portion of said third electrode,
a gate electrode in abutting contact with said insulating layer, and
said first layer forming an asymmetrical channel therethrough of said first conductivity type between said second and third layers and having an impedance controlled by the voltage applied between said gate and said drain electrodes;
a second metal oxide semiconductor transistor formed in said substrate, said second transistor including;
a region formed in said substrate remote from said region of said first transistor, said region being of said first conductivity type,
a V-notch extending into said region;
a first doped layer abutting said region and a portion of a first edge of said V-notch, said first layer being of said second conductivity type,
a second doped layer having a portion thereof abutting said region and a portion of a second edge of said V-notch, said second layer being of said first conductivity type and having a carrier concentration greater than said region,
a third doped layer abutting said second layer remote from said region and abutting another portion of said second edge of said V-notch, said third layer being of said second conductivity type,
an insulating layer abutting said region and said first, second, and third layers in contact with said first and second edges of said V-notch, said insulating layer further contacting portions of said first and third layers remote from said V-notch,
a source electrode in ohmic contact with another portion of said first layer remote from said V-notch,
a drain electrode having a portion thereof in ohmic contact with another portion of said third layer remote from said V-notch and another portion thereof in ohmic contact with a portion of said second layer remote from said V-notch,
a gate electrode abutting said insulating layer,
said region having a relatively low impedance from said first layer, a long said first edge of said V-notch, around the apex of said V-notch, and a long said second edge of said V-notch to said second layer in response to a zero bias being applied to said gate electrode, and
said second layer forming a stopping channel therethrough to electron conductance during said zero biasing and forming a short channel length electron conductance path therethrough with fast response time in response to a positive bias being applied to said third electrode;
said drain and source electrodes of said first and second transistors respectively being formed by a common metal electrode in ohmic contact with opposite conductivity doped layers of said first and second transistors respectively; and
said gate electrodes of said first and second transistors being substantially short circuited together.

16. The device of claim 15 wherein said substrate has a <100> crystalline structure and said V notch is formed in <111> stopping planes of said substrate.

* * * * *